US009326903B2

(12) United States Patent

Locke

(10) Patent No.: US 9,326,903 B2

(45) Date of Patent: May 3, 2016

(54) MULTI-LAYERED SUPPORT SYSTEM

(71) Applicant: HUNTLEIGH TECHNOLOGY LIMITED, Bedfordshire (GB)

(72) Inventor: Christopher Locke, Bournemouth (GB)

(73) Assignee: Huntleigh Technology Limited (GB)

(*) Notice: Subject to any disclaimer, the term of this patent is extended or adjusted under 35 U.S.C. 154(b) by 82 days.

(21) Appl. No.: 13/633,643

(22) Filed: Oct. 2, 2012

(65) Prior Publication Data

US 2013/0082723 A1 Apr. 4, 2013

Related U.S. Application Data

(60) Provisional application No. 61/542,451, filed on Oct. 3, 2011.

(51) Int. Cl.

| | |
|---|---|
| ***G01R 27/02*** | (2006.01) |
| ***G01L 1/12*** | (2006.01) |
| ***A61G 7/057*** | (2006.01) |

(52) U.S. Cl.

CPC ........ *A61G 7/05715* (2013.01); *A61G 7/05769* (2013.01)

(58) Field of Classification Search

CPC ....................... A61G 7/05715; A61G 7/05769

USPC .......................................................... 324/699

See application file for complete search history.

(56) References Cited

U.S. PATENT DOCUMENTS 2,826,244 A 3/1958 Hurley ........................... 5/652.2
3,735,559 A 5/1973 Salemme .......................... 95/52
3,836,900 A * 9/1974 Mansfield ..................... 600/534
4,185,341 A 1/1980 Scales ............................... 5/699
4,483,030 A 11/1984 Flick et al. ........................ 5/691
4,665,575 A 5/1987 Raught ............................. 5/722
4,825,488 A 5/1989 Bedford ............................ 5/726
4,853,992 A 8/1989 Yu .................................... 5/423
4,971,065 A 11/1990 Pearce .......................... 600/534
4,997,230 A 3/1991 Spitalnick ................ 297/180.11
5,007,123 A 4/1991 Salyards ........................... 5/699
5,035,014 A 7/1991 Blanchard ......................... 5/424
5,090,074 A 2/1992 Scales et al. ...................... 5/699
5,249,319 A 10/1993 Higgs ............................... 5/714
5,410,297 A 4/1995 Joseph et al. .............. 340/573.7
5,416,935 A 5/1995 Nieh ................................. 5/423
5,473,783 A 12/1995 Allen ............................ 5/652.2
5,498,278 A 3/1996 Edlund ............................. 96/11
5,611,096 A 3/1997 Bartlett et al. .................... 5/617

(Continued)

FOREIGN PATENT DOCUMENTS

DE 203 06 348 9/2003
DE 203 09 793 10/2003

(Continued)

OTHER PUBLICATIONS

AccuMax Quantum Complete, Hill-Rom Services, Inc., copyright 2008-2012. Available online at http://www.woundsource.com/print/product/accumax-quantum-complete. Accessed Mar. 15, 2012.

Extended European Search Report issued in European Patent Application No. 09828235.3, dated Sep. 21, 2012.

Extended European Search Report issued in European Patent Application No. 12181372.9, dated Oct. 1, 2012.

(Continued)

*Primary Examiner* — Jermele M Hollington
*Assistant Examiner* — Farhana Hoque

(57) ABSTRACT

In various embodiments, a support system includes a cover sheet with an electrically conductive spacer material.

24 Claims, 5 Drawing Sheets

(56) References Cited

U.S. PATENT DOCUMENTS

| | | | | |
|---|---|---|---|---|
| 5,640,728 | A | 6/1997 | Graebe | 5/606 |
| 5,647,079 | A | 7/1997 | Hakamiun et al. | 5/713 |
| 5,681,368 | A | 10/1997 | Rahimzadeh | 95/19 |
| 5,701,621 | A | 12/1997 | Landi et al. | 5/691 |
| 5,755,000 | A | 5/1998 | Thompson | 5/713 |
| 5,882,349 | A | 3/1999 | Wilkerson et al. | 604/289 |
| 5,887,304 | A | 3/1999 | Von der Heyde | 5/726 |
| 5,926,884 | A | 7/1999 | Biggie et al. | 5/714 |
| 6,065,166 | A | 5/2000 | Sharrock et al. | 5/630 |
| 6,085,369 | A | 7/2000 | Feher | 5/423 |
| 6,182,315 | B1 | 2/2001 | Lee | 5/690 |
| 6,272,707 | B1 | 8/2001 | Robrecht et al. | 5/724 |
| 6,288,076 | B1 | 9/2001 | Kostyniak et al. | 514/299 |
| 6,336,237 | B1 | 1/2002 | Schmid | 5/726 |
| 6,341,395 | B1 | 1/2002 | Chao | 5/423 |
| 6,353,950 | B1 | 3/2002 | Bartlett et al. | 5/617 |
| 6,418,579 | B2 | 7/2002 | Perez et al. | 5/713 |
| 6,421,859 | B1 | 7/2002 | Hicks et al. | 5/722 |
| 6,487,739 | B1 | 12/2002 | Harker | 5/729 |
| 6,493,889 | B2 | 12/2002 | Kocurek | 5/423 |
| 6,527,832 | B2 | 3/2003 | Oku et al. | 96/4 |
| 6,546,576 | B1 | 4/2003 | Lin | 5/423 |
| 6,671,911 | B1 | 1/2004 | Hill et al. | 5/713 |
| 6,687,937 | B2 | 2/2004 | Harker | 5/726 |
| 6,709,492 | B1 | 3/2004 | Spadaccini et al. | 96/6 |
| 6,779,592 | B1 | 8/2004 | Ichigaya | 165/46 |
| 6,782,574 | B2 | 8/2004 | Totton et al. | 5/726 |
| 6,868,569 | B2 | 3/2005 | VanSteenburg | 5/709 |
| 6,904,629 | B2 | 6/2005 | Wu | 5/423 |
| 7,036,163 | B2 | 5/2006 | Schmid | 5/423 |
| 7,043,767 | B2 | 5/2006 | Jaeger | 2/87 |
| 7,140,495 | B2 | 11/2006 | Hester et al. | 210/490 |
| 7,165,281 | B2 | 1/2007 | Larssson et al. | 5/724 |
| 7,191,482 | B2 | 3/2007 | Romano et al. | 5/714 |
| 7,240,386 | B1 | 7/2007 | McKay et al. | 5/724 |
| 7,290,300 | B1 | 11/2007 | Khambete | 5/423 |
| 7,296,315 | B2 | 11/2007 | Totton et al. | 5/737 |
| 7,311,685 | B1 | 12/2007 | Policastro | 602/3 |
| 7,334,280 | B1 | 2/2008 | Swartzburg | 5/724 |
| 7,357,830 | B2 | 4/2008 | Weidmann | 95/52 |
| 7,480,953 | B2 | 1/2009 | Romano et al. | 5/714 |
| 7,631,377 | B1 | 12/2009 | Sanford | 5/423 |
| 7,637,573 | B2 | 12/2009 | Bajic et al. | 297/452.43 |
| 7,712,164 | B2 | 5/2010 | Chambers | 5/423 |
| 7,886,385 | B2 | 2/2011 | Carlitz | 5/691 |
| 7,913,332 | B1 | 3/2011 | Barnhart | 5/423 |
| 7,914,611 | B2 | 3/2011 | Vrzalik et al. | 96/11 |
| 7,937,789 | B2 | 5/2011 | Feher | 5/421 |
| 7,937,791 | B2 | 5/2011 | Meyer et al. | 5/727 |
| 7,966,680 | B2 | 6/2011 | Romano et al. | 5/713 |
| 8,118,920 | B2 | 2/2012 | Vrzalik et al. | 96/11 |
| 2001/0023512 | A1 | 9/2001 | Perez et al. | 5/713 |
| 2002/0073489 | A1 | 6/2002 | Totton et al. | 5/713 |
| 2002/0129449 | A1 | 9/2002 | Harker | 5/726 |
| 2002/0148047 | A1 | 10/2002 | Corzani et al. | 5/738 |
| 2003/0019044 | A1 | 1/2003 | Larsson et al. | 5/724 |
| 2003/0145380 | A1 | 8/2003 | Schmid | 5/423 |
| 2004/0003471 | A1 | 1/2004 | VanSteenburg | 5/709 |
| 2004/0064888 | A1 | 4/2004 | Wu | 5/423 |
| 2004/0214495 | A1 | 10/2004 | Foss et al. | 442/199 |
| 2004/0237203 | A1 | 12/2004 | Romano et al. | 5/713 |
| 2005/0011009 | A1 | 1/2005 | Wu | 5/729 |
| 2005/0022308 | A1 | 2/2005 | Totton et al. | 5/713 |
| 2005/0086739 | A1 | 4/2005 | Wu | 5/423 |
| 2005/0188467 | A1 | 9/2005 | Woolfson | 5/726 |
| 2005/0278863 | A1 | 12/2005 | Bahash et al. | 5/726 |
| 2006/0010607 | A1 | 1/2006 | Schneider | 5/713 |
| 2006/0080778 | A1 | 4/2006 | Chambers | 5/652 |
| 2006/0220657 | A1* | 10/2006 | Mitchell | B60N 2/002 324/609 |
| 2007/0056101 | A1 | 3/2007 | Mahajan et al. | 5/600 |
| 2007/0056116 | A1 | 3/2007 | Galardo | 5/724 |
| 2007/0135878 | A1* | 6/2007 | Lachenbruch et al. | 607/108 |
| 2007/0234481 | A1 | 10/2007 | Totton et al. | 5/714 |
| 2007/0261548 | A1* | 11/2007 | Vrzalik et al. | 95/52 |
| 2007/0266499 | A1 | 11/2007 | O'Keefe et al. | 5/713 |
| 2007/0283498 | A1 | 12/2007 | Shelby | 5/706 |
| 2008/0028536 | A1 | 2/2008 | Hadden-Cook | 5/724 |
| 2008/0060131 | A1 | 3/2008 | Tompkins | 5/423 |
| 2008/0098529 | A1 | 5/2008 | Flocard et al. | 5/652.2 |
| 2008/0263776 | A1 | 10/2008 | O'Reagan et al. | 5/714 |
| 2008/0299854 | A1* | 12/2008 | Hilleary et al. | 442/136 |
| 2009/0322124 | A1 | 12/2009 | Barkow et al. | 297/180.14 |
| 2010/0043143 | A1 | 2/2010 | O'Reagan et al. | 5/421 |
| 2010/0095461 | A1 | 4/2010 | Romano et al. | 5/710 |
| 2010/0175196 | A1 | 7/2010 | Lafleche et al. | 5/707 |
| 2010/0229302 | A1* | 9/2010 | De Bock | 5/248 |
| 2010/0287701 | A1 | 11/2010 | Frias | 5/423 |
| 2011/0004997 | A1 | 1/2011 | Hale et al. | 5/699 |
| 2011/0010850 | A1 | 1/2011 | Frias | 5/423 |
| 2011/0010855 | A1 | 1/2011 | Flessate | 5/484 |
| 2011/0035880 | A1 | 2/2011 | Cole et al. | 5/423 |
| 2011/0037597 | A1* | 2/2011 | Dixon et al. | 340/573.4 |
| 2011/0061164 | A1* | 3/2011 | Genaro | 5/424 |
| 2011/0072583 | A1* | 3/2011 | McNeely et al. | 5/616 |
| 2011/0107514 | A1 | 5/2011 | Brykalski et al. | 5/421 |
| 2011/0111196 | A1* | 5/2011 | Hubbs | 428/220 |
| 2011/0154575 | A1 | 6/2011 | Kiser | 5/706 |
| 2011/0296917 | A1* | 12/2011 | Reinmuth et al. | 73/514.32 |

FOREIGN PATENT DOCUMENTS

| | | |
|---|---|---|
| DE | 203 09 794 | 10/2003 |
| EP | 0218301 | 4/1987 |
| EP | 0870449 | 10/1998 |
| EP | 1151698 A2 | 11/2001 |
| EP | 1645258 A1 | 4/2006 |
| EP | 1687139 | 8/2006 |
| EP | 1863369 | 12/2007 |
| EP | 1901636 | 3/2008 |
| EP | 1919328 | 5/2008 |
| EP | 1971246 | 9/2008 |
| EP | 2047770 | 4/2009 |
| EP | 2258242 | 12/2010 |
| EP | 2319474 | 5/2011 |
| GB | 2 235 872 | 3/1991 |
| JP | H02-11144 | 1/1990 |
| JP | 11-164757 | 6/1999 |
| JP | 11-169262 | 6/1999 |
| JP | 11-332697 | 12/1999 |
| JP | 2000-152854 | 6/2000 |
| JP | 2002-125809 | 5/2002 |
| JP | 2003-230605 | 8/2003 |
| JP | 2004-188052 | 8/2004 |
| WO | WO 00/24353 | 5/2000 |
| WO | WO 2004/082551 | 9/2004 |
| WO | WO 2005/046988 | 5/2005 |
| WO | WO 2006/122614 | 4/2006 |
| WO | WO 2007/003018 | 6/2006 |
| WO | WO 2006/105169 | 10/2006 |
| WO | WO 2007/034311 | 3/2007 |
| WO | WO 2011/067720 | 6/2011 |

OTHER PUBLICATIONS

Gaymar SPR-Plus, Pressure Distributing Low Air Loss System, Gaymar Industries, Inc. Product Brochure. Copyright 2009. Available online at http://www.gaymar.com/wcsstore/ExtendedSites CatalogAssetStore/pdf/SPR__Plus__New__5.pdf. Accessed Mar. 15, 2012.

Office Communication issued in Canadian Patent Application No. 2,651,960, dated Dec. 12, 2012.

Office Communication issued in Japanese Patent Application No. 2009-510186, dated Oct. 25, 2011. (English summary of Japanese document provided).

Office Communication issued in U.S. Appl. No. 13/048,642, dated Jun. 16, 2011.

Office Communication, issued in Australian Patent Application No. 2007249236, dated Mar. 17, 2011.

Office Communication, issued in Chinese Patent Application No. 200780016996.3, dated Mar. 1, 2010. (English translation of Chinese document provided).

(56) References Cited

OTHER PUBLICATIONS

Office Communication, issued in European Patent Application No. EP07783677, dated Feb. 15, 2011.
Office Communication, issued in European Patent Application No. EP07783677, dated Oct. 12, 2011.
Office communication, issued in Japanese Patent Application No. 2009-510186, mailed on Apr. 10, 2012. (English Translation).
Office Communication, issued in U.S. Appl. No. 11/746,953, dated Aug. 11, 2010.
Office Communication, issued in U.S. Appl. No. 11/746,953, dated Feb. 25, 2010.
PCT International Preliminary Report on Patentability issued in International Application No. PCT/US07/68801, dated Nov. 11, 2008.
PCT International Search Report and Written Opinion issued in International application No. PCT/US2011/038147, dated Oct. 5, 2011.
PCT International Search Report and Written Opinion issued in PCT Application No. PCT/US2012/058477, dated Jan. 25, 2013.
PCT International Search Report and Written Opinion, issued in International patent application No. PCT/US2009/065182, dated Jul. 6, 2010.
PCT International Search Report issued in International Application No. PCT/US07/68801, dated Nov. 2, 2007.
Span America PressureGuard Easy Air Low Air Loss Product, Span America, Product Page, Copyright 2012. Available online at http://www.spanamerica.com/easy_air.php. Accessed Mar. 15, 2012.

* cited by examiner

MULTI-LAYERED SUPPORT SYSTEM

CROSS-REFERENCE TO RELATED APPLICATIONS

This application claims priority to U.S. Provisional Patent Application No. 61/542,451, filed Oct. 3, 2011, which is incorporated by reference in its entirety.

FIELD OF THE INVENTION

The present disclosure relates generally to support surfaces for independent use and for use in association with beds and other support platforms, and more particularly but not by way of limitation to support surfaces that aid in the prevention, reduction, and/or treatment of decubitus ulcers and the transfer of moisture and/or heat from the body.

BACKGROUND

Patients and other persons restricted to bed for extended periods incur the risk of forming decubitus ulcers. Decubitus ulcers (commonly known as bed sores, pressure sores, pressure ulcers, etc.) can be formed when blood supplying the capillaries below the skin tissue is interrupted due to external pressure against the skin. This pressure can be greater than the internal blood pressure within a capillary and thus, occlude the capillary and prevent oxygen and nutrients from reaching the area of the skin in which the pressure is exerted. Moreover, moisture and heat on and around the person can exacerbate ulcers by causing skin maceration, among other associated problems.

Over many years products have been developed to address this problem, and are often focused on off-loading the patient through means of alternating pressure surfaces which vary the load point of the patient such that damage is reduced. Other devices have been developed which provide climate management through allowing air to move under the patient to prevent fluids collecting, or evaporating any moisture or fluids which may have collected. These are typically known as low air loss systems.

SUMMARY

Exemplary embodiments of the present disclosure are directed to apparatus, systems and methods to aid in the prevention of decubitus ulcer formation and/or promote the healing of such ulcer formation.

Exemplary embodiments comprise an electrically-conductive spacer material including, e.g. an open-celled, reticulated foam. In certain embodiments, the foam is a typical open-cell polyethylene foam that can conduct electricity as it is impregnated with carbon, and/or coated or plated. One common use of standard commercially available forms of this foam is for electromagnetic interference (EMI) shielding and anti-static protection. In one particular embodiment, Granufoam™ silver coated foam (available from Kinetic Concepts, Inc., San Antonio, Tex.) may be used.

The electrical conductivity can change with the thickness of the spacer material, for example due to compression of the spacer material resulting from a person being supported by the spacer material. In certain embodiments, the reduced thickness also reduces the electrical resistance of the spacer material, which can be measured and enables the spacer material to act as a form of a pressure sensor.

In exemplary embodiments, the degree of compression is proportional to the reduction in electrical resistance. With electrical components, this change can be detected, and can be used to indicate to the user that the compression of the foam has increased beyond nominal limits.

In certain embodiments, it is possible to manufacture electrically conductive foams with a wide range of fillers such as silver, nickel-graphite, or copper, and different types of resin, such as polyurethane. Certain embodiments may utilize carbonized foam, in which the conductive foam is carbonized polyethylene foam. Particular embodiments may also comprise polyethylene foam that is carbonized by dipping it in a black carbon solution. When the foam dries out, it becomes conductive.

Specific embodiments may also comprise foam that is coated or plated, e.g. silver coated or copper-and/or-nickel-plated. Plated or coated foam is typically more conductive than carbonized foam. For example, the resistivity of carbonized foams is usually greater than 100 ohms/sq inch, while nickel-plated foams are less resistive. Nickel-plated foams can have a surface resistance less than 0.1 ohms/sq in in sheet form, and Z-axis resistivity less than 0.2 ohms/sq in at fifty percent compression.

Certain embodiments include a cover sheet comprising: an electrically-conductive spacer material comprising an upper surface, a lower surface and a thickness measured between the upper surface and the lower surface; a vapor permeable material proximal to the upper surface of the electrically-conductive spacer material; an electrical circuit configured to measure an electrical parameter that is related to the thickness of the electrically-conductive spacer material; and an indicator configured to provide an indication when the electrical parameter is outside a predetermined range. In particular embodiments, the electrical circuit is configured to measure a resistance of the electrically-conductive spacer material. In specific embodiments, the resistance of the electrically-conductive spacer material is decreased as the thickness of the electrically-conductive spacer material is decreased.

In certain embodiments, the electrical circuit is configured to measure a voltage across the electrically-conductive spacer material. In particular embodiments, the electrical circuit comprises a power supply, a first conductor, and a second conductor electrically-coupled to the electrically-conductive spacer material. In certain embodiments, the first and second conductors are proximal to the lower surface of the electrically-conductive spacer material. In specific embodiments, the first and second conductors are interdigitated.

In certain embodiments, the electrical circuit is configured to measure the electrical parameter at a plurality of locations. In particular embodiments, the indication is a visual indication and/or an audible indication. In certain embodiments, the electrically-conductive spacer material comprises a coated foam. In specific embodiments, the coated foam comprises silver, copper or nickel. In certain embodiments, the electrically-conductive spacer material comprises a carbonized foam. In particular embodiments, the electrically-conductive spacer material comprises an open-celled, reticulated foam.

In certain embodiments, the electrically-conductive spacer material is coupled to sections of spacer material that are not electrically-conductive. In specific embodiments, the cover sheet is configured to be placed upon a mattress. In particular embodiments, the mattress is an alternating pressure therapy mattress. Certain embodiments, may comprise an air mover configured to provide an air flow through the electrically-conductive spacer material. In particular embodiments, the air mover is configured to increase the air flow if the electrical parameter reaches a pre-determined value. In certain embodiments, the air mover is configured to push air away from the air mover. In particular embodiments, the air mover is configured to pull air towards the air mover.

Certain embodiments comprise a method of detecting a thickness of a spacer material in a cover sheet, where the method comprises: causing an electrical current to be conducted through an electrical circuit comprising the spacer material, wherein a first portion of the spacer material is electrically conductive; and measuring an electrical parameter in the electrical circuit comprising the spacer material, wherein the electrical parameter is related to a thickness of the spacer material.

In certain embodiments, the electrical parameter is a resistance of the electrical circuit. In particular embodiments, the resistance of the electrical circuit is decreased as the thickness of the spacer material is decreased. In certain embodiments, the electrical parameter is a voltage measured across the spacer material. In specific embodiments, the electrical circuit comprises a power supply, a first conductor, and a second conductor electrically-coupled to the spacer material. In particular embodiments, first and second conductors are proximal to a lower surface of the spacer material. In certain embodiments, first and second conductors are interdigitated. Specific embodiments further comprise measuring the electrical parameter at a plurality of locations.

Certain embodiments further comprise providing an indication when the electrical parameter is outside a predetermined range. In particular embodiments, the spacer material comprises a coated foam. In specific embodiments, the coated foam comprises silver, copper or nickel. In certain embodiments, the spacer material comprises a carbonized foam. In particular embodiments, the spacer material comprises an open-celled, reticulated foam. In certain embodiments, a second portion of the spacer material is not electrically-conductive.

Particular embodiments may further comprise placing the cover sheet upon a mattress. In certain embodiments, the mattress may be an alternating pressure therapy mattress. Specific embodiments may further comprise providing an air flow through the spacer material. Particular embodiments may further comprise increasing the air flow if the electrical parameter reaches a pre-determined value. In certain embodiments, the air flow through the spacer material is directed away from an air mover. In specific embodiments, the air flow through the spacer material is directed toward an air mover.

BRIEF DESCRIPTION OF THE DRAWINGS

While exemplary embodiments of the present invention have been shown and described in detail below, it will be clear to the person skilled in the art that changes and modifications may be made without departing from the scope of the invention. As such, that which is set forth in the following description and accompanying drawings is offered by way of illustration only and not as a limitation. The actual scope of the invention is intended to be defined by the following claims, along with the full range of equivalents to which such claims are entitled.

In addition, one of ordinary skill in the art will appreciate upon reading and understanding this disclosure that other variations for the invention described herein can be included within the scope of the present invention. For example, portions of the support system shown and described may be incorporated with existing mattresses or support materials. Other embodiments may utilize the support system in seating applications, including but not limited to, wheelchairs, chairs, recliners, benches, etc.

In the following Detailed Description of Disclosed Embodiments, various features are grouped together in several embodiments for the purpose of streamlining the disclosure. This method of disclosure is not to be interpreted as reflecting an intention that exemplary embodiments of the invention require more features than are expressly recited in each claim. Rather, as the following claims reflect, inventive subject matter lies in less than all features of a single disclosed embodiment. Thus, the following claims are hereby incorporated into the Detailed Description of Disclosed Embodiments, with each claim standing on its own as a separate embodiment.

Figure 1:
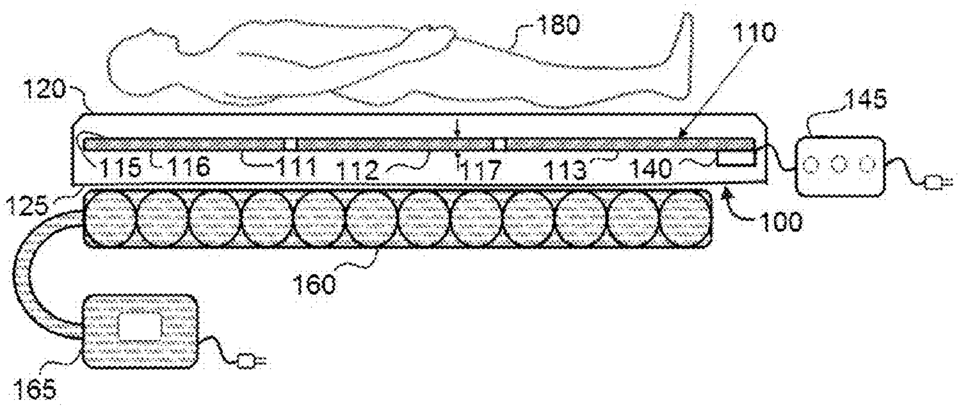

FIG. 1 illustrates a side view of a first exemplary embodiment of a cover sheet and a support mattress supporting a person.

Figure 2:
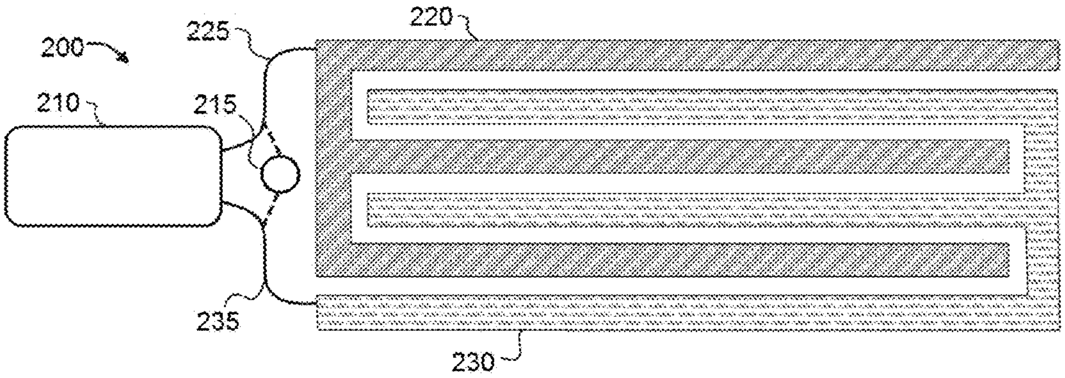

FIG. 2 illustrates a top view of components of the exemplary embodiment of the cover sheet of FIG. 1.

Figure 3:
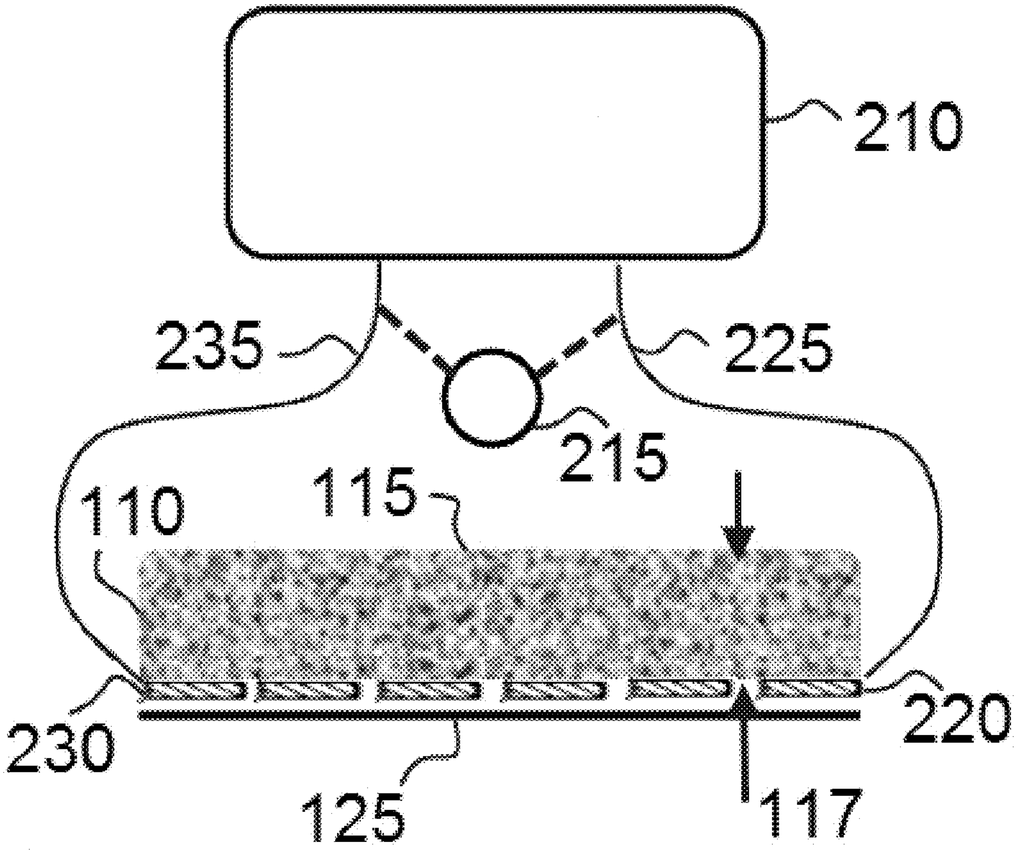

FIG. 3 illustrates an end view of the components of FIG. 2.

Figure 4:
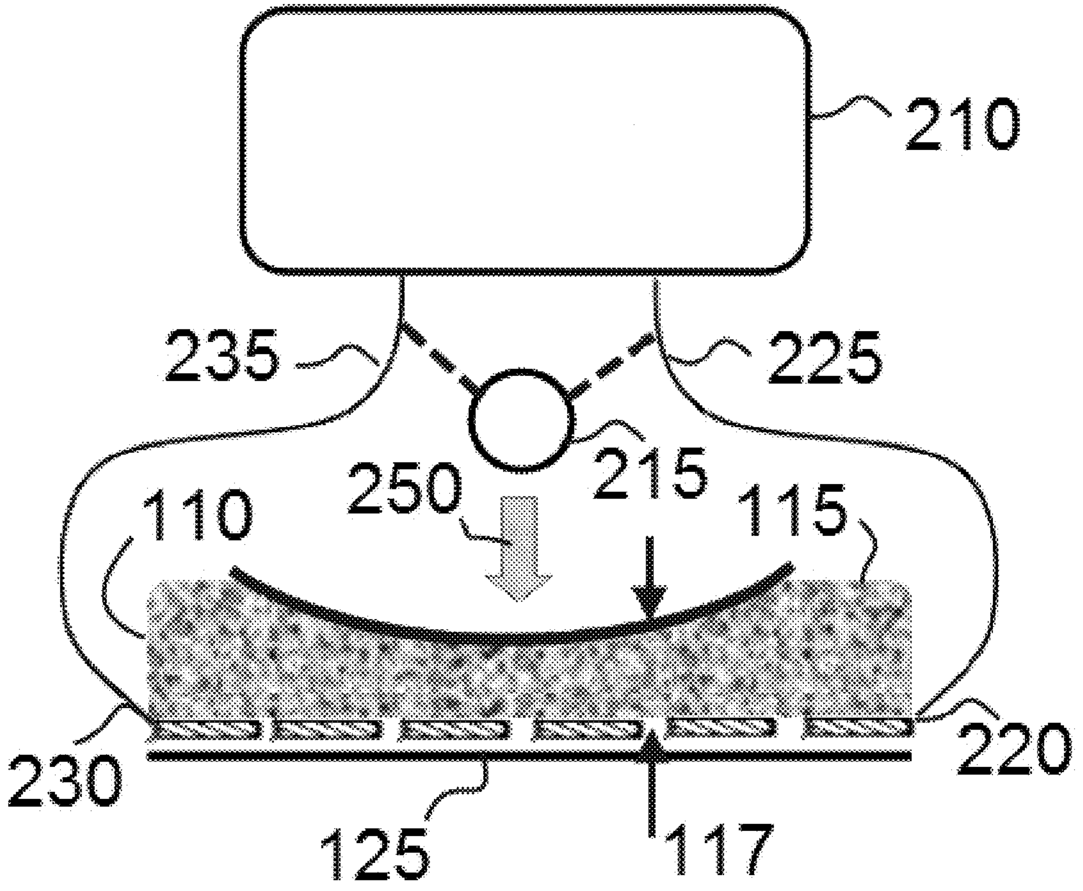

FIG. 4 illustrates an end view of the components of FIG. 2 under compression.

Figure 5:
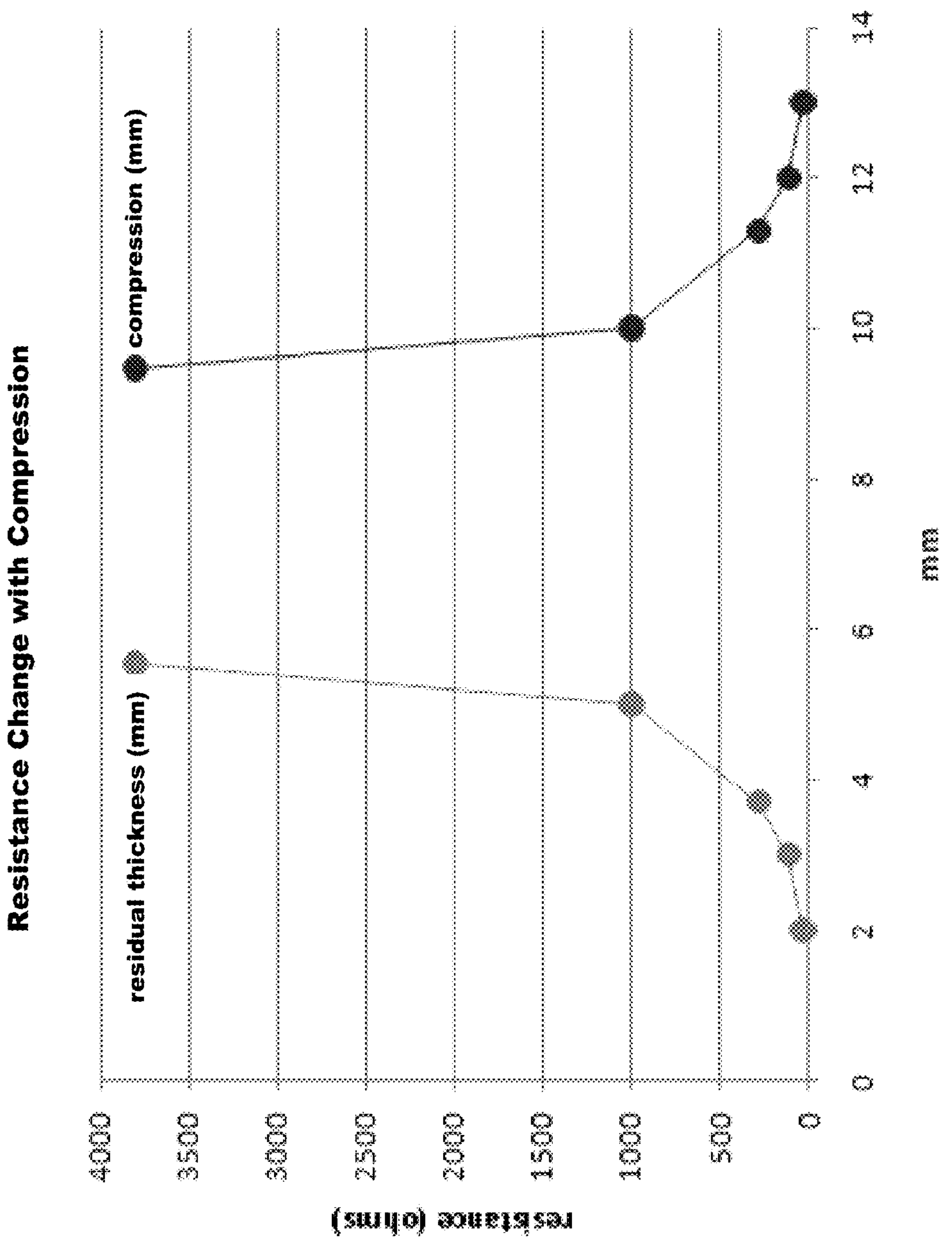

FIG. 5 illustrates a graph of resistance versus thickness and compression for an exemplary embodiment.

Figure 6:
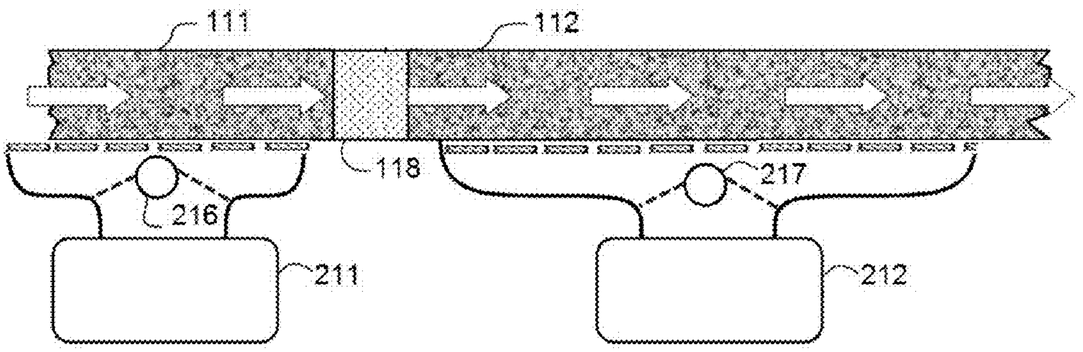

FIG. 6 illustrates a side view of components of the exemplary embodiment of the cover sheet of FIG. 1.

Figure 7:
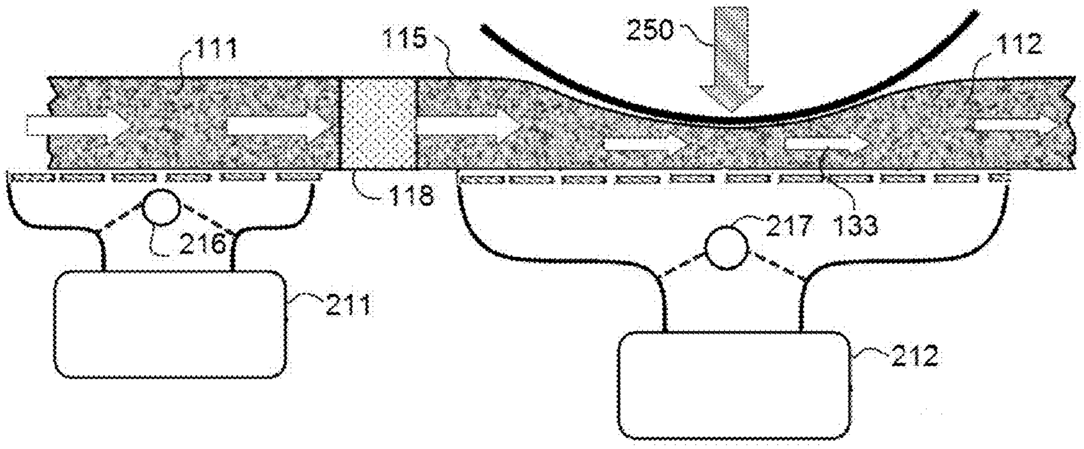

FIG. 7 illustrates a side view of components of the exemplary embodiment of the cover sheet of FIG. 1 under compression.

DETAILED DESCRIPTION OF DISCLOSED EMBODIMENTS

Exemplary embodiments of the present disclosure are directed to apparatus, systems and methods to aid in the prevention of decubitus ulcer formation and/or promote the healing of such ulcer formation. For example, in various embodiments, preventing ulcer formation and/or healing decubitus ulcers can be accomplished through the use of a multi-layer cover sheet. Exemplary embodiments of the multi-layer cover sheet can be utilized to aid in the removal of moisture, vapor, and heat adjacent and proximal the patient surface interface and in the environment surrounding the patient by providing a surface that absorbs and/or disperses the moisture, vapor, and heat from the patient. In addition, the exemplary embodiments of the multi-layer cover sheet can be utilized in combination with a number of support surfaces or platforms to provide a reduced interface pressure between the patient and the cover sheet on which the patient is positioned. This reduced interface pressure can help to prevent the formation of decubitus ulcers.

Existing systems can also include a cover sheet with a manifolding or spacer material that allows air flow through the material to aid in the removal of moisture, vapor, and heat adjacent and proximal the patient surface interface. Such systems may also provide an air mover to provide for increased air flow through the spacer material.

However, if the weight of the patient reduces the thickness of the spacer material below a certain amount, the ability of the system to function properly is reduced and skin maceration may occur. Changes in the underlying surface may be possible to ensure proper operation if the user is alerted to the issue. Also, incorrect operation of both surfaces may result in pressure points under the patient which could also lead to skin breakdown and ulcer formation.

What is needed is a method to alert the caregiver if there is a locus of high load pressure under the patient which could result in skin damage and if flow in the manifolding material is restricted or blocked such that fluids are not managed to reduce the chance of maceration. Additionally, this needs to be accommodated within a low cost disposable product without adding complication and cost to the design.

In various exemplary embodiments, the cover sheet may include a number of layers. Each layer may be formed of a number of different materials that exhibit various properties. These properties may include the level of friction or shear of a surface, the permeability of a vapor, a gas, a liquid, and/or a solid, and various phases of the vapor, the gas, the liquid, and the solid, and other properties.

For example, in exemplary embodiments, the multi-layer cover sheet may include materials that provide for a low air loss feature, where one or more layers exhibit various air, vapor, and liquid permeable properties and/or where one or more layers are bonded or sealed together. As used herein, a low air loss feature of a multi-layer cover sheet includes, but is not limited to: a multi-layer cover sheet that allows air and vapor to pass through the first or top layer in the presence of a partial pressure difference in vapor between the internal and external environments of the multi-layer cover sheet; a multi-layer cover sheet that allows air and vapor to pass through the first layer in the absence of a partial pressure difference in vapor between the internal and external environments of the multi-layer cover sheet; and a multi-layer cover sheet that allows air and vapor to move into and/or out of the multi-layer cover sheet through the apertures in one or more layers.

In other exemplary embodiments, the multi-layer cover sheet can include materials that provide for substantially no air flow, where one or more layers include air impermeable properties and/or where layers are bonded or sealed together to a layer comprising a spacer material. In such exemplary embodiments, this configuration may control the direction of movement of air from inside to outside (e.g., under influence by a source of positive pressure at the air inlet at the air mover for the cover sheet) and from outside to inside (e.g., under influence by a source of negative pressure at the air inlet at the air mover for the cover sheet) the multi-layer cover sheet. Certain exemplary embodiments comprise a multi-layer cover sheet including, but is not limited to, the following: a cover sheet that prevents or substantially prevents air from passing through the first layer, but allows for the passing of vapor through the first layer; a cover sheet that prevents or substantially prevents air from moving through the first layer in the presence of a partial vapor pressure difference between the internal and external environments of the multi-layer cover sheet, but allows for the passing of vapor through the first layer; and a cover sheet that prevents or substantially prevents air from moving out of the multi-layer cover sheet via the material forming a particular layer of the cover sheet, but allows air to move through the apertures in one or more layers.

In various exemplary embodiments, systems are provided that can include a number of components that both aid in prevention of decubitus ulcer formation and to remove moisture and/or heat from the patient. For example, systems can include a multi-layer cover sheet that can be used in conjunction with a variety of support surfaces, such as an inflatable mattress, a foam mattress, a gel mattress, a water mattress, or a RIK® Fluid Mattress of a hospital bed. In such exemplary embodiments, features of the multi-layer cover sheet can help to remove moisture from the patient and to lower interface pressure between a patient and the surface of the multi-layer cover sheet, while features of the inflatable or foam mattress can aid in the prevention and/or healing of decubitus ulcers by further lowering interface pressures at areas of the skin in which external pressures are typically high, as for example, at bony prominences such as the heel and the hip area of the patient. In other exemplary embodiments, systems can include the multi-layer cover sheet used in conjunction with a chair or other support platform.

Referring initially to FIGS. 1-4, an exemplary embodiment of a cover sheet 100 is illustrated disposed on a support mattress 160 and supporting a person 180. In this exemplary embodiment, cover sheet 100 comprises an electrically-conductive spacer material 110 comprising an upper surface 115, a lower surface 116, and a thickness 117 measured between the upper surface 115 and the lower surface 116. In this embodiment, cover sheet 100 also comprises a vapor permeable material 120 proximal to upper surface 115. In the embodiment shown, cover sheet 100 comprises a lower layer 125 located between spacer material 110 and support mattress 160. In particular embodiments, support mattress 160 may be configured as an alternating pressure therapy mattress and may be coupled to a high pressure air source 165.

It is understood that the figures are not to scale and that the spacing between elements may be exaggerated for clarity. For example, in certain exemplary embodiments, vapor permeable material 120 may be in direct contact with upper surface 115. In the illustrated embodiment, cover sheet 100 comprises an air mover 140 configured to provide air flow through spacer material 110, and a power source 145 configured to provide power to air mover 140. In certain embodiments air mover 140 may be configured to push air away from air mover 140 and through spacer material 110. In other embodiments, air mover 140 may be configured to pull air toward air mover 140 and through spacer material 110.

As used in this disclosure, the term "spacer material" (and related terms) should be construed broadly to include any material that includes a volume of air within the material and allows air to move through the material. In exemplary embodiments, spacer materials allow air to flow through the material when a person is laying on the material while the material is supported by a mattress. Examples of such spacer materials include open cell foam, polymer particles, and a material sold by Tytex® under the trade name AirX™.

Referring specifically now to the exemplary embodiment in FIG. 2, an electrical circuit 200 comprises a power source 210, a first conductor 220, and a second conductor 230. First and second conductors 220, 230 can be electrically coupled to power source 210 via a first wire 225 and second wire 235. A measuring device 215 (e.g., a voltmeter or ammeter) can be used to measure an electrical parameter (e.g. a voltage or amperage) of electrical circuit 200.

In exemplary embodiments, first conductor 220 and second conductor 230 can be placed proximal to lower surface 116 of electrically-conductive spacer material 110. In specific embodiments, first and second conductors 220, 230 are electrically coupled to electrically-conductive spacer material 110. In particular embodiments, first and second conductors 220, 230 are interdigitated, as shown in FIG. 2. In exemplary embodiments, power source 210 can provide a voltage across first and second conductors 220, 230, which are in contact with lower surface 116 of electrically-conductive spacer material 110, as shown in the end view of FIG. 3.

In this exemplary embodiment, the resistance (and electrical conductivity) of electrically-conductive spacer material 110 is related to thickness 117. As shown in FIG. 4, when a force 250 is applied to upper surface 115, thickness 117 of electrically-conductive spacer material 110 can be decreased. In exemplary embodiments force 250 may be applied, for example, when person 180 is supported by cover sheet 100. In this exemplary embodiment, as thickness 117 is decreased, the resistance of electrically-conductive spacer material 110 also decreases.

FIG. 5 illustrates a graph of the resistance of electrically-conductive spacer material 110 versus thickness 117 (and compression of the electrically-conductive spacer material). As shown in FIG. 5, as thickness 117 is decreased from approximately 5 mm to 2 mm, the resistance decreases from approximately 1000 ohms to approximately 0 ohms.

With the relation between thickness 117 and an electrical parameter (e.g. resistance) known, electrical circuit 200 can be used to correlate a measured electrical parameter with thickness 117. The measurement of the electrical parameter can then be used to verify that thickness 117 is maintained at a level sufficient to provide adequate air flow from air mover 140 to reduce the likelihood of patient 180 developing pressure ulcers.

For example, in one exemplary embodiment, power source 210 may apply a known voltage to first and second conductors 220, 230 and a current in electrical circuit can be measured by measuring device 215. As patient 180 compresses thickness 117 of electrically-conductive spacer material 110, the resistance of electrically-conductive spacer material 110 will be decreased. Lower surface 116 of electrically-conductive spacer material 110 is electrically coupled to first and second conductors 220, 230. As the resistance of electrically-conductive spacer material 110 decreases with a constant voltage applied by power source 210, the current detected by measuring device 215 will increase.

In certain embodiments, power source 210 may be a component of a digital multimeter configured to provide a voltage of less than 3.0 volts at a current of approximately 0.2 mA at the measurement terminals. During operation, the increased resistance of coversheet 100 will reduce the voltage at a given current. The surface area of the cover sheet 100 may require a higher voltage, but in exemplary embodiments it should be approximately nine volts or less.

In certain embodiments, it is also possible that a low frequency alternating current could be helpful in reducing the breakdown of moisture that may accumulate in cover sheet 100. It is understood that water vapor and possibly condensed fluids can collect in spacer material 110, but in exemplary embodiments the conductive spacer material has a lower electrical resistance that is not significantly affected. In addition, with exemplary embodiments the electrical power delivered to the foam is low enough to avoid adverse safety issues for the user. The evaporation effect on the spacer material together with its hydrophobic nature should expedite the removal of moisture vapor from the spacer material.

In certain embodiments, when the current detected by measuring device 215 increases to a predetermined level, an indication can be provided to alert a user. In certain embodiments, the indication can be a visual or audible indication. Such an indication can alert a user that thickness 117 has decreased to a level sufficient to restrict air flow from air mover 140 below a desired level. In specific embodiments, an indication can be provided if measuring device detects an electrical parameter outside a predetermined range (for example, if a measured electrical current goes above a certain value due to decreased thickness or goes below a certain value due to a loose connection in electrical circuit 200).

In certain embodiments, cover sheet 100 may comprise a control system configured to increase air flow from air mover 140 in response to a decrease in thickness 117. In particular embodiments, control system may comprise a motor speed controller, which may use variable voltage or pulse-width modulation (PWM) control to vary the speed of the motor within air mover 140.

In specific embodiments, the change in resistance can be monitored by a controller which may comprise an electronic comparator circuit which will detect the resistance change and then vary the speed of a motor driving air mover 140. In particular embodiments, the controller may have one triggering threshold, or multiple different thresholds, which alter the speed of air mover 140. Such control system can be advantageous, for example, with a battery-powered system used for a light weight patient, where air mover 140 may only need to operate at a low power level for extended durations, and increase power when electrically-conductive spacer material 110 is sufficiently compressed.

In certain exemplary embodiments, the control system may comprise a processor that records the analogue readings from electrically-conductive spacer material 110 as it changes resistance and dynamically adjusts the motor speed again, in an analogue fashion. Such a controller may even provide feedback to the user of the degree to which the patient is compressing electrically-conductive spacer material 110, which may be a useful indicator of the degree of risk of maceration to which the patient is exposed. The controller may also indicate to the caregiver if the patient occludes a significant area of cover sheet 100 to airflow and presents a high risk of maceration.

In particular embodiments, cover sheet 100 may comprise multiple sections including for example, a head section 111, a middle section 112, and a foot section 113 as shown in FIG. 1. In particular embodiments, head section 111, middle section 112, and foot section 113 may be separated with sections 118, 119 of non-conducting spacer material. In such embodiments, an electrical parameter can be measure in individual sections and correlated to a thickness of electrically-conductive spacer material 110.

Referring now to FIGS. 6-7, in certain embodiments cover sheet 100 may comprise multiple power sources 211, 212 and measuring devices 216, 217 configured to measure an electrical parameter in individual sections 111, 112 of cover sheet 100. By measuring an electrical parameter in individual sections, a user can determine in which section the electrical parameter is outside of an acceptable range. For example, the user can determine in which section the thickness of electrically-conductive spacer material 110 has been compressed beyond an acceptable limit or in which section there may be an issue with the electrical circuit, such as an open circuit.

As shown in FIG. 7, section 112 has been compressed when a force 250 is applied to upper surface 115, and the thickness 117 of electrically-conductive spacer material 110 is decreased. An air flow 133 through compressed section 112 can be reduced due to the compression of electrically-conductive spacer material 110 and the increased resistance associated with the reduced air space available in compressed section 112. In certain embodiments, a control system may increase the operating speed of air mover 140 (shown in FIG. 1) if the thickness of compressed section 112 is reduced below a certain value (as measured from the correlation with the electrical parameter measured by measuring device 217).

The invention claimed is:

1. A cover sheet comprising:

an electrically-conductive foam material comprising a volume of air within the foam material which allows air to move through the foam material, said foam material having an upper surface, a lower surface and a thickness measured between the upper surface and the lower surface;

a vapor permeable material proximal to the upper surface of the electrically-conductive foam material;

an electrical circuit with first and second conductors electrically coupled to the electrically-conductive foam material, the electrical circuit to measure an electrical parameter of the foam material itself that is related to the thickness of the electrically-conductive foam material; and an indicator to provide an indication when the electrical parameter is outside a predetermined range.

2. The cover sheet of claim 1 wherein the electrical circuit is configured to measure a resistance of the electrically-conductive foam material.

3. The cover sheet of claim 2 wherein the resistance of the electrically-conductive foam material is decreased as the thickness of the electrically-conductive foam material is decreased.

4. The cover sheet of claim 1 wherein the electrical circuit is configured to measure a voltage across the electrically-conductive foam material.

5. The cover sheet of claim 1 wherein the electrical circuit further comprises a power supply electrically coupled to the first and second conductors.

6. The cover sheet of claim 1 wherein the first and second conductors are proximal to the lower surface of the electrically-conductive foam material.

7. The cover sheet of claim 1 wherein the first and second conductors are interdigitated.

8. The cover sheet of claim 1 wherein the electrical circuit is configured to measure the electrical parameter at a plurality of locations.

9. The cover sheet of claim 1 wherein the indication is at least one of a visual indication and an audible indication.

10. The cover sheet of claim 1 wherein the electrically-conductive foam material comprises a coated foam.

11. The cover sheet of claim 10 wherein the coated foam comprises silver, copper or nickel.

12. The cover sheet of claim 1 wherein the electrically-conductive foam material comprises a carbonized foam.

13. The cover sheet of claim 1 wherein the electrically-conductive foam material comprises an open-celled, reticulated foam.

14. The cover sheet of claim 1 wherein the electrically-conductive foam material is coupled to sections of foam material that are not electrically-conductive.

15. The cover sheet of claim 1 wherein the cover sheet is configured to be placed upon a mattress.

16. The cover sheet of claim 15 wherein the cover sheet is disposed upon an alternating pressure therapy mattress.

17. The cover sheet of claim 1, further comprising an air mover configured to provide an air flow through the electrically-conductive foam material.

18. The cover sheet of claim 17 wherein the air mover is configured to increase the air flow if the electrical parameter reaches a pre-determined value.

19. The cover sheet of claim 17 wherein the air mover is configured to push air away from the air mover.

20. The air mover of claim 17 wherein the air mover is configured to pull air towards the air mover.

21. A method of detecting a thickness of a spacer material in a coverlet, the method comprising:

causing an electrical current to be conducted through the spacer material of the coverlet, wherein a first portion of the spacer material has an upper surface, a lower surface and a thickness there between that is compressible and electrically conductive; and measuring an electrical parameter of the spacer material itself via sensors operatively associated and to form an electrical circuit with the spacer material, wherein the electrical parameter is related to the thickness of the spacer material.

22. The method of claim 21 wherein the electrical parameter is a resistance of the spacer.

23. The method of claim 21 wherein the electrical parameter is a voltage measured across the spacer material.

24. The method of claim 21 further comprising providing an indication when the electrical parameter is outside a predetermined range.

* * * * *